(12) United States Patent
Ma et al.

(10) Patent No.: US 7,038,294 B2
(45) Date of Patent: May 2, 2006

(54) PLANAR SPIRAL INDUCTOR STRUCTURE WITH PATTERNED MICROELECTRONIC STRUCTURE INTEGRAL THERETO

(75) Inventors: Ssu-Pin Ma, Taipei (TW); Yen-Shih Ho, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 710 days.

(21) Appl. No.: 09/821,521

(22) Filed: Mar. 29, 2001

(65) Prior Publication Data

US 2002/0142512 A1    Oct. 3, 2002

(51) Int. Cl.
*H01L 29/00*    (2006.01)

(52) U.S. Cl. .................... 257/528; 257/531; 257/533; 257/909

(58) Field of Classification Search ................ 257/528, 257/531, 533, 904
See application file for complete search history.

(56) References Cited

U.S. PATENT DOCUMENTS

| | | | |
|---|---|---|---|
| 4,857,893 A * | 8/1989 | Carroll | 340/572 |
| 5,396,101 A * | 3/1995 | Shiga | 257/531 |
| 5,416,356 A * | 5/1995 | Staudinger et al. | 257/531 |
| 5,481,131 A | 1/1996 | Staudinger et al. | |
| 5,839,184 A | 11/1998 | Ho et al. | |
| 5,861,647 A | 1/1999 | Zhao et al. | |
| 5,861,809 A * | 1/1999 | Eckstein et al. | 340/572 |
| 5,863,806 A | 1/1999 | Lue | |
| 5,915,188 A | 6/1999 | Ramakrishnan et al. | |
| 5,945,892 A | 8/1999 | Kato et al. | |
| 6,114,937 A * | 9/2000 | Burghartz et al. | 336/200 |
| 6,294,401 B1 * | 9/2001 | Jacobson et al. | 438/99 |
| 6,310,387 B1 * | 10/2001 | Seefeldt et al. | 257/531 |
| 6,452,278 B1 * | 9/2002 | DiCaprio et al. | 257/777 |

\* cited by examiner

*Primary Examiner*—Tom Thomas
*Assistant Examiner*—Matthew E. Warren
(74) *Attorney, Agent, or Firm*—Tung & Assoc.

(57) ABSTRACT

Within a method for fabricating a microelectronic fabrication there is first provided a substrate. There is then formed over the substrate a spirally patterned conductor layer which terminates in a microelectronic structure within the center of the spirally patterned conductor layer. The spirally patterned conductor layer forms a planar spiral inductor, and the microelectronic structure formed within the center of the spirally patterned conductor layer further comprises a series of electrically interconnected sub-patterns. The method contemplates a microelectronic fabrication fabricated in accord with the method. The microelectronic fabrication is fabricated with optimal performance while occupying minimal microelectronic substrate area.

2 Claims, 2 Drawing Sheets

PLANAR SPIRAL INDUCTOR STRUCTURE WITH PATTERNED MICROELECTRONIC STRUCTURE INTEGRAL THERETO

CROSS-REFERENCE TO RELATED APPLICATION

This application is related to co-assigned application Ser. No. 09/588,788, filed Jun. 6, 2000, titled "Planar Spiral Inductor Structure Having Enhanced Q Value," the disclosure and references from which related co-assigned application are incorporated herein fully by reference.

BACKGROUND OF THE INVENTION

1. Field of the Invention

The present invention relates generally to inductor structures employed within microelectronic fabrications. More particularly, the present invention relates to planar spiral inductor structures employed within microelectronic fabrications.

2. Description of the Related Art

Microelectronic fabrications are fabricated from microelectronic substrates over which are formed patterned microelectronic conductor layers which are separated by microelectronic dielectric layers.

As microelectronic fabrication integration levels and functionality levels have increased, it has become common in the art of microelectronic fabrication to employ in addition to generally conventional microelectronic device structures such as but not limited to transistor structures, resistor structures, diode structures and capacitor structures when fabricating microelectronic fabrications, less conventional microelectronic device structures such as inductor structures when fabricating microelectronic fabrications. In particular, within microelectronic fabrications which are intended to be employed within high frequency microelectronic fabrication applications, such as mobile communications high frequency microelectronic fabrication applications, it is often common to employ microelectronic inductor structures in conjunction with microelectronic capacitor structures within those microelectronic fabrications.

While microelectronic inductor structures, and in particular microelectronic inductor structures in conjunction with microelectronic capacitor structures, are thus desirable and often essential within the art of microelectronic fabrication, microelectronic inductor structures, and in particular microelectronic inductor structures in conjunction with microelectronic capacitor structures, are nonetheless not entirely without problems in the art of microelectronic fabrication. In that regard, it is typically desirable in the art of microelectronic fabrication, but nonetheless not always readily achievable in the art of microelectronic fabrication, to fabricate microelectronic fabrications having formed therein microelectronic inductor structures, and in particular microelectronic inductor structures in conjunction with microelectronic capacitor structures, with optimal performance while occupying minimal microelectronic substrate area within a microelectronic fabrication.

It is thus towards the goal of fabricating within microelectronic fabrications microelectronic inductor structures, and in particular microelectronic inductor structures in conjunction with microelectronic capacitor structures, with optimal performance while occupying minimal microelectronic substrate area within a microelectronic fabrication, that the present invention is directed.

Various microelectronic inductor structures having desirable properties, and/or methods for fabrication thereof, have been disclosed in the art of microelectronic fabrication.

For example, Yamaguchi et al., in "Characteristics and Analysis of a Thin Film Inductor With Closed Magnetic Circuit Structure," IEEE Trans. on Magnetics, Vol. 28(5), Sep. 1992, pp. 3015–17, discloses for use within a microelectronic fabrication a planar spiral inductor structure with enhanced inductance. The planar spiral inductor structure realizes the foregoing object by employing when fabricating the planar spiral inductor structure a patterned copper core layer which is fully encapsulated with a magnetic material layer which contacts the patterned copper core layer, to provide surrounding the patterned copper core layer a closed magnetic circuit which provides the planar spiral inductor structure with enhanced inductance.

In addition, Shiga, in U.S. Pat. No. 5,396,101, discloses a planar spiral inductor structure for use within a microelectronic fabrication, where the planar spiral inductor structure may be formed while occupying minimal microelectronic substrate area within the microelectronic fabrication while providing the planar spiral inductor structure with enhanced inductance within the planar spiral inductor structure. To realize the foregoing objects, the planar spiral inductor structure employs a core layer formed of a high permeability magnetic material formed within a cavity within the planar spiral inductor structure, wherein the core layer may further be patterned to form a grid of electrically insulated patterned core layers.

Further in addition, Staudinger et al., in U.S. Pat. No. 5,481,131, discloses an integrated circuit microelectronic fabrication having fabricated therein a planar spiral inductor structure in conjunction with a planar capacitor structure, wherein there is minimized the use of substrate area when fabricating the planar spiral inductor structure in conjunction with the planar capacitor structure within the microelectronic fabrication. To realize the foregoing object, portions of the planar spiral inductor structure and the planar capacitor structure are fabricated employing a single patterned conductor layer, wherein the single patterned conductor layer is patterned to provide a planar spiral inductor which is surrounded by a capacitor plate employed within the planar capacitor.

Yet further, Ho et al., in U.S. Pat. No. 5,839,184, discloses a method for fabricating, while minimizing use of substrate area and while providing enhanced performance, an inductor structure within a packaged integrated circuit microelectronic fabrication. To realize the foregoing objects, the method employs when fabricating the packaged integrated circuit microelectronic fabrication at least one lead within a lead frame employed for packaging an integrated circuit microelectronic fabrication die as an inductor core within an inductor which accesses a bond pad within the integrated circuit microelectronic fabrication die which is packaged, and further wherein a bond wire which is bonded to the bond pad within the integrated circuit microelectronic fabrication die is employed as an inductor winding for the lead which serves as the inductor core.

Still further, Zhao et al, in U.S. Pat. No. 5,861,647, discloses an inductor structure or a capacitor structure which may be fabricated with enhanced efficiency within a microelectronic fabrication. Each of the inductor structure and the capacitor structure comprises a metal plug layer filled into a via which separates a pair of metal layers within the microelectronic fabrication, wherein the length of the metal plug layer is the same as the length of the pair of metal layers within the microelectronic fabrication, but wherein the width of the metal plug layer is less than the width of the pair of metal layers within the microelectronic fabrication.

Still yet further, Lue et al., in U.S. Pat. No. 5,863,806, discloses a method for fabricating within a semiconductor integrated circuit microelectronic fabrication a microcoil structure which may be employed for forming an inductor structure within the semiconductor integrated circuit microelectronic fabrication. To realize the foregoing object, the microcoil structure is fabricated employing a series of geometrically parallel conductively doped regions within a semiconductor substrate, wherein the series of geometrically parallel conductively doped regions within the semiconductor substrate is separated by a dielectric layer through which is formed a series of vias which provides access for a series of geometrically parallel patterned conductor layers which connect with the series of geometrically parallel conductively doped regions to form the microcoil structure within the semiconductor integrated circuit microelectronic fabrication.

Yet still further, Ramakrishnan et al., in U.S. Pat. No. 5,915,188, discloses a method for fabricating, with both enhanced inductance and enhanced capacitance within a microelectronic fabrication, a microelectronic inductor structure in conjunction with a microelectronic capacitor structure within the microelectronic fabrication. To realize the foregoing object the method employs forming a single patterned conductor layer which is patterned to form both: (1) a planar spiral within a planar spiral inductor which is employed for forming the microelectronic inductor structure; and (2) a planar capacitor plate within a planar capacitor employed for forming the microelectronic capacitor structure, in conjunction with a copper-iron alloy oxide dielectric layer which passivates the planar spiral within the planar spiral inductor and serves as a capacitor dielectric layer within the planar capacitor.

Finally, Kato et al., in U.S. Pat. No. 5,945,892, discloses a microelectronic fabrication having fabricated therein a microelectronic inductor structure in conjunction with a microelectronic capacitor structure, but wherein there is avoided within the microelectronic inductor structure in conjunction with the microelectronic capacitor structure eddy current losses. To realize the foregoing object, the microelectronic fabrication employs when fabricating the microelectronic inductor structure a conductor inductive element which is generally perpendicular to a pair of capacitor plate layers within a planar capacitor which comprises the microelectronic capacitor structure.

The teachings of each of the foregoing disclosures are incorporated herein fully by reference.

Desirable in the art of microelectronic fabrication are additional methods and materials which may be employed for fabricating within microelectronic fabrications microelectronic inductor structures, and in particular microelectronic inductor structures in conjunction with microelectronic capacitor structures, with optimal performance while occupying minimal microelectronic substrate area within a microelectronic substrate which is employed for fabricating the microelectronic inductor structure, and more particularly the microelectronic inductor structure in conjunction with the microelectronic capacitor structure.

It is towards the foregoing objects that the present invention is directed.

SUMMARY OF THE INVENTION

A first object of the present invention is to provide a method for fabricating a microelectronic inductor structure within a microelectronic fabrication, as well as the microelectronic inductor structure fabricated within the microelectronic fabrication while employing the method.

A second object of the present invention is to provide a method for fabricating a microelectronic inductor structure in conjunction with a microelectronic capacitor structure within a microelectronic fabrication, as well as the microelectronic inductor structure in conjunction with the microelectronic capacitor structure fabricated within the microelectronic fabrication while employing the method.

A third object of the present invention is to provide a method, a microelectronic inductor structure and a microelectronic inductor structure in conjunction with a microelectronic capacitor structure in accord with the first object of the present invention or the second object of the present invention, wherein the microelectronic inductor structure and/or the microelectronic inductor structure in conjunction with the microelectronic capacitor structure are/is fabricated with optimal performance while occupying minimal microelectronic substrate area.

A fourth object of the present invention is to provide a method in accord with the first object of the present invention, the second object of the present invention or the third object of the present invention, which method is readily commercially implemented.

In accord with the objects of the present invention, there is provided a method for fabricating a microelectronic inductor structure within a microelectronic fabrication, as well as the microelectronic inductor structure which is fabricated within the microelectronic fabrication while employing the method.

To practice the method of the present invention, there is first provided a substrate. There is then formed over the substrate a spirally patterned conductor layer which terminates in a microelectronic structure integral thereto formed within the center of the spirally patterned conductor layer, wherein the spirally patterned conductor layer forms a planar spiral inductor, and wherein microelectronic structure formed within the center of the spirally patterned conductor layer further comprises a series of electrically interconnected sub-patterns.

The method of the present invention contemplates a planar spiral inductor, or, for example and without limitation, a planar spiral inductor in conjunction with a planar capacitor, fabricated in accord with the method of the present invention.

There is provided by the present invention: (1) a method for fabricating a microelectronic inductor structure within a microelectronic fabrication, as well as the microelectronic inductor structure fabricated within the microelectronic fabrication while employing the method; and (2) a method for fabricating a microelectronic inductor structure in conjunction with a microelectronic capacitor structure within a microelectronic fabrication, as well as the microelectronic inductor structure in conjunction with the microelectronic capacitor structure fabricated within the microelectronic fabrication while employing the method, wherein the microelectronic inductor structure and/or the microelectronic inductor structure in conjunction with the microelectronic capacitor structure are/is fabricated with optimal performance while occupying minimal microelectronic substrate area. A microelectronic inductor structure, or a microelectronic inductor structure in conjunction with a microelectronic capacitor structure, fabricated in accord with the present invention is fabricated with optimal performance insofar as the microelectronic inductor structure employs formed within its center a microelectronic structure comprising a series of electrically interconnected sub-patterns. Similarly, a microelectronic inductor structure, or a microelectronic inductor structure in conjunction with a microelectronic capacitor structure, fabricated in accord with the present invention is fabricated while occupying minimal microelectronic substrate area insofar as a microelectronic structure which in part comprises the microelectronic inductor structure is fabricated within a cavity defined by a spirally patterned conductor layer which also in part comprises the microelectronic inductor structure.

The method of the present invention is readily commercially implemented. As will become clear within the context of the Description of the Preferred Embodiments which follows, a microelectronic inductor structure, or in the alternative a microelectronic inductor structure in conjunction with a microelectronic capacitor structure, in accord with the present invention may be fabricated employing methods and materials as are otherwise conventional in the art of microelectronic fabrication. Since it is largely structural features of a microelectronic inductor structure, or a microelectronic inductor structure in conjunction with a microelectronic capacitor structure, which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

Figure 1:
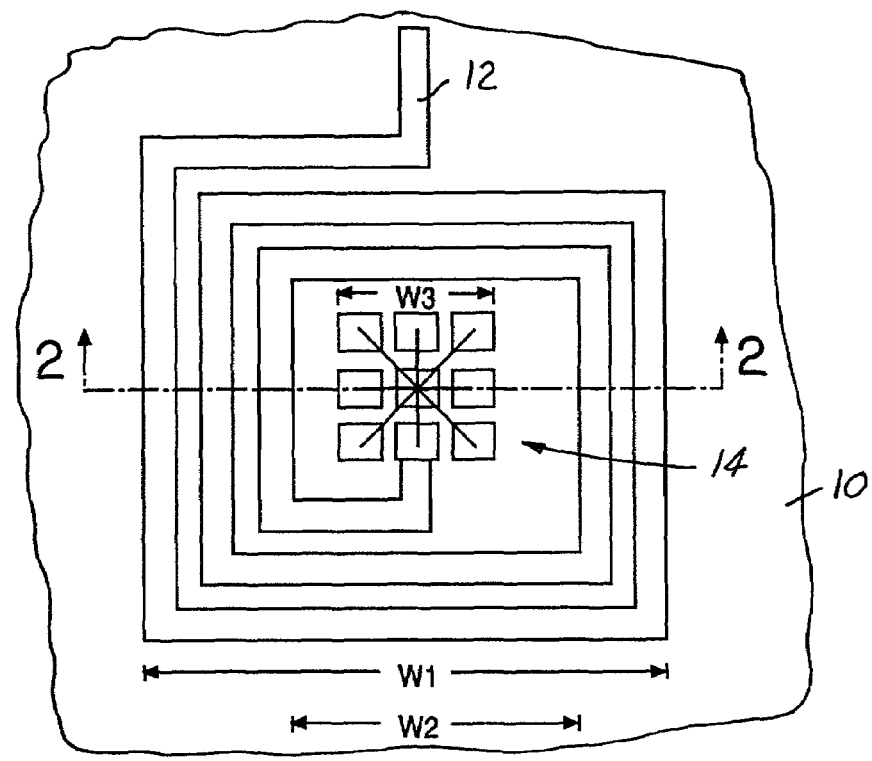
FIG. 1 shows a schematic plan view diagram of a microelectronic inductor structure fabricated in accord with the present invention.

There is provided by the present invention: (1) a method for fabricating a microelectronic inductor structure within a microelectronic fabrication, as well as the microelectronic inductor structure fabricated within the microelectronic fabrication while employing the method; and (2) a method for fabricating a microelectronic inductor structure in conjunction with a microelectronic capacitor structure within a microelectronic fabrication, as well as the microelectronic inductor structure in conjunction with the microelectronic capacitor structure fabricated within the microelectronic fabrication while employing the method, wherein the microelectronic inductor structure and/or the microelectronic inductor structure in conjunction with the microelectronic capacitor structure are/is fabricated with optimal performance while occupying minimal microelectronic substrate area. A microelectronic inductor structure, or a microelectronic inductor structure in conjunction with a microelectronic capacitor structure, fabricated in accord with the present invention is fabricated with optimal performance insofar as the microelectronic inductor structure employs formed within its center a microelectronic structure comprising a series of electrically interconnected sub-patterns. Similarly, a microelectronic inductor structure, or a microelectronic inductor structure in conjunction with a microelectronic capacitor structure, fabricated in accord with the present invention is fabricated while occupying minimal microelectronic substrate area insofar as a microelectronic structure which in part comprises the microelectronic inductor structure is fabricated within a cavity defined by a spirally patterned conductor layer which also in part comprises the microelectronic inductor structure.

Although a microelectronic inductor structure, or a microelectronic inductor structure in conjunction with a microelectronic capacitor structure, fabricated in accord with the present invention provides particular value when fabricating an integrated circuit microelectronic fabrication which may be employed for higher frequency microelectronic fabrication applications, such as but not limited to wireless communications higher frequency microelectronic fabrication applications, a microelectronic inductor structure, or a microelectronic inductor structure in conjunction with a microelectronic capacitor structure, in accord with the present invention may be fabricated within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications, as employed within microelectronic fabrication applications including but not limited to higher frequency (i.e., greater than about 800 MHZ) microelectronic fabrication applications, mid range frequency (i.e., from about 100 MHZ to about 800 MHz) microelectronic fabrication applications and lower frequency (i.e., less than about 100 MHZ) microelectronic fabrication applications.

Referring now to FIG. 1 there is shown a schematic plan view diagram of a microelectronic inductor structure fabricated in accord with a preferred embodiment of the present invention.

Shown in FIG. 1 is a substrate 10 having formed thereupon a spirally patterned conductor layer 12 which terminates in a bond pad region 14 integral thereto, where the bond pad region 14 is formed within the center of the spirally patterned conductor layer 12, and where the bond pad region 14 of the spirally patterned conductor layer 12 is formed of a series of electrically interconnected sub-patterns. Within the schematic plan view diagram of FIG. 1, the spirally patterned conductor layer 12 forms a planar spiral inductor structure in accord with the present invention. Within the present invention insofar as the bond pad region 14 of the spirally patterned conductor layer 12 is formed within the center of the spirally patterned conductor layer 12, there is minimized microelectronic substrate area employed when fabricating the planar spiral inductor structure of the present invention. Similarly, within the present invention and the preferred embodiment of the present invention, insofar as the bond pad region 14 of the spirally patterned conductor layer 12 is formed into a series of electrically interconnected sub-patterns, there is attenuated within the planar spiral inductor structure of the present invention eddy currents induced within the bond pad region 14 of the planar spiral inductor structure of the present invention since the bond pad region 14 of the spirally patterned conductor layer 12 of the present invention which comprises a planar spiral inductor structure of the present invention is formed within the center of the spirally patterned conductor layer 12.

As is illustrated within the schematic plan-view diagram of FIG. 1, a microelectronic inductor structure of the present invention which is formed as the planar spiral inductor structure of the present invention is formed of a bi-directional outer spiral width W1 of from about 60 to about 500 microns while similarly having a bi-directional inner spiral width W2 of from about 40 to about 200 microns which forms a cavity into which is formed the bond pad region 14 of the spirally patterned conductor layer 12. As is also illustrated within the schematic plan view diagram of FIG. 1, the bond pad region 14 of the spirally patterned conductor layer 12 is formed of a bi-directional linewidth W3 of from about 30 to about 120 microns and is formed into the series of electrically interconnected sub-patterns. As is illustrated within the schematic plan view diagram of FIG. 1, when forming the series of electrically interconnected sub-patterns within the bond pad region 14 of the spirally patterned conductor layer 12, it is preferred that the electrically interconnected sub-patterns be formed in a fashion which optimally minimizes eddy currents within the bond pad region 14 of the spirally patterned conductor layer 12. Thus, the electrically interconnected sub-patterns within the bond pad region 14 are formed such as to inhibit circular pathways for eddy current flow within the bond pad region 14 of the spirally patterned conductor layer 12. Thus, typically and preferably the electrically interconnected sub-patterns within the bond pad region 14 of the spirally patterned conductor layer 12 are not formed as concentric circles or of other geometric shape which might allow for circular pathways for eddy current flow within the bond pad region 14 of the spirally patterned conductor layer 12, but rather the electrically interconnected sub-patterns within the bond pad region 14 of the spirally patterned conductor layer provide for electrical breaks which inhibit circular pathways for eddy current flow within the bond pad region 14 of the spirally patterned conductor layer 12. Typically and preferably, the bond pad region 14 of the spirally patterned conductor layer 12 is patterned to at least 2 sub-patterns, more preferably at least 4 sub-patterns and most preferably from about 6 to about 8 sub-patterns.

Although not specifically illustrated within the schematic plan view diagram of FIG. 1, at portions of the spirally patterned conductor layer 12 other than those within the bond pad region 14 of the spirally patterned conductor layer 12, the spirally patterned conductor layer 12 is formed with a linewidth of from about 2 to about 20 microns. Similarly, at portions of the spirally patterned conductor layer 12 other than those within the bond pad region 14 of the spirally patterned conductor layer 12, adjacent traces of the spirally patterned conductor layer 12 are separated by a separation width of from about 0.5 to about 5 microns. Finally, although the schematic plan view diagram of FIG. 1 illustrates the planar spiral inductor structure of the present invention as being formed employing two and a quarter full cycles in a nominally rectangular geometry, planar spiral inductor structures in accord with the present invention may be formed employing geometries including but not limited to triangular geometries, square geometries, rectangular geometries, higher order polygonal geometries, elliptical geometries and circular geometries having full cycles ranging from about 1 to about 20.

Figure 2:
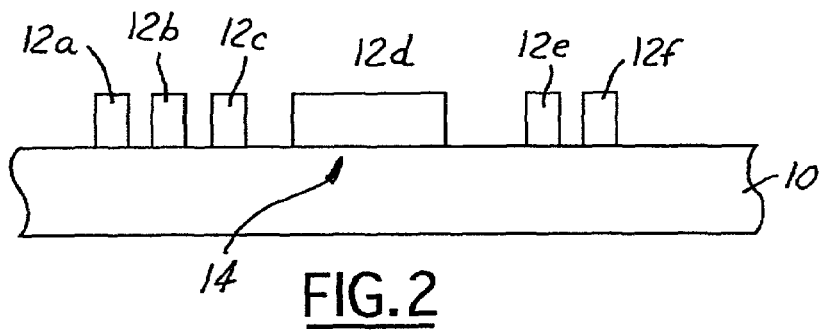
FIG. 2 shows a schematic cross-sectional diagram of a microelectronic inductor structure corresponding with the microelectronic inductor structure whose schematic plan view diagram is illustrated in FIG. 1.

Referring now to FIG. 2, there is shown a schematic cross-sectional diagram of a microelectronic inductor structure corresponding with the microelectronic inductor structure whose schematic plan view diagram is illustrated in FIG. 1.

Similarly within the schematic plan view diagram of FIG. 1, there is shown within the schematic cross-sectional diagram of FIG. 2 the substrate 10 having formed thereupon a series of spirally patterned conductor layers 12a, 12b, 12c, 12d, 12e and 12f which derives from the spirally patterned conductor layer 12 as illustrated within the schematic plan view diagram of FIG. 1. Within the schematic cross-sectional diagram of FIG. 2, the spirally patterned conductor layer 12d corresponds with the bond pad region 14 of the spirally patterned conductor layer 12 as illustrated within the schematic plan view diagram of FIG. 1.

Within the preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated in the schematic cross-sectional diagram of FIG. 2, the substrate 10 may consist of a substrate alone as employed within the microelectronic fabrication, or in an alternative, the substrate 10 may comprise the substrate as employed within the microelectronic fabrication, where the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed of microelectronic materials including but not limited to microelectronic conductor materials, microelectronic semiconductor materials and microelectronic dielectric materials.

Similarly, although also not specifically illustrated within the schematic cross-sectional diagram of FIG. 2, the substrate 10, typically and preferably, but not exclusively, when the substrate 10 consists of or comprises a semiconductor substrate employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to, transistors, resistors, diodes and capacitors.

Most preferably, although not exclusively, within the preferred embodiment of the present invention the substrate 10: (1) comprises a semiconductor substrate employed within a semiconductor integrated circuit microelectronic fabrication; (2) the semiconductor substrate has formed therein and/or thereupon microelectronic devices as are conventional within the semiconductor integrated circuit microelectronic fabrication within which is employed the semiconductor substrate; and (3) the top surface of the substrate 10 is formed of an integrated circuit microelectronic layer formed of a dielectric material.

Within the preferred embodiment of the present invention with respect to the series of spirally patterned conductor layers 12a, 12b, 12c, 12d, 12e and 12f, the series of spirally patterned conductor layers 12a, 12b, 12c, 12d, 12e and 12f may be formed from any of several conductor materials as are conventional in the art of microelectronic fabrication for forming inductor structures within microelectronic fabrications, such conductor materials being selected from the group including but not limited to: (1) non-magnetic metal and non-magnetic metal alloy (such as but not limited to aluminum, aluminum alloy, copper and copper alloy) conductor materials: (2) magnetic metal and magnetic metal alloy (such as permalloy and higher order alloys incorporating permalloy alloy) conductor materials; (3) doped polysilicon (having a dopant concentration greater than about 1E15 dopant atoms per cubic centimeter) and polycide (doped polysilicon/metal silicide stack) conductor materials; and (3) laminates thereof. Typically and preferably, each of the spirally patterned conductor layers 12a, 12b, 12c, 12d, 12e and 12f is formed to a thickness of from about 5000 to about 30,000 angstroms.

Figure 3:
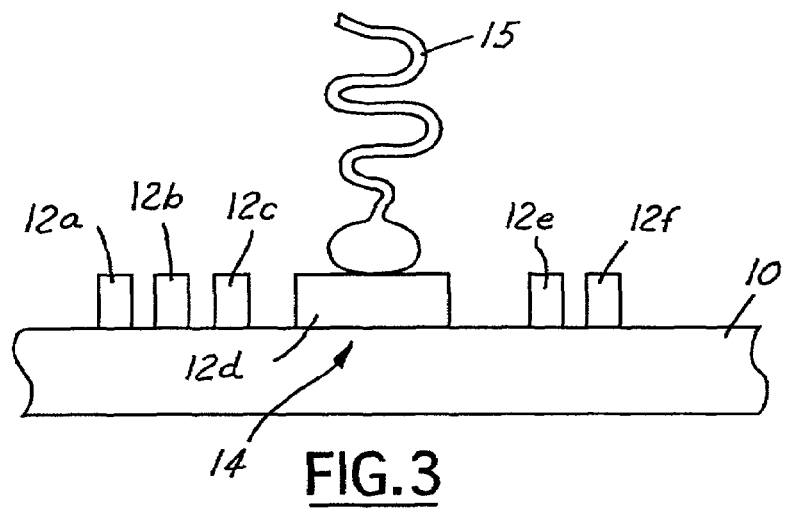
FIG. 3 shows a schematic cross-sectional diagram illustrating the results of further processing of the microelectronic inductor structure whose schematic cross-sectional diagram is illustrated in FIG. 2.

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein there is bonded upon the spirally patterned conductor layer 12d which forms the bond pad region 14 of the spirally patterned conductor layer 12 a bond wire 15.

Within the preferred embodiment of the present invention, there may be bonded upon the spirally patterned conductor layer 12d which forms the bond pad region 14 the bond wire 15 to form from the microelectronic fabrication whose schematic cross-sectional diagram is illustrated in FIG. 2 the microelectronic fabrication whose schematic cross-sectional diagram is illustrated in FIG. 3 while employing bonding methods as are conventional in the art of microelectronic fabrication, such bonding methods including but not limited to compression bonding methods, ultrasonic bonding methods, and thermoacoustic bonding methods. Typically and preferably, within the preferred embodiment of the present invention, the bonding wire 15 is formed of a gold, gold alloy, copper, copper alloy, aluminum or aluminum alloy conductor material formed to a diameter of from about 0.5 to about 2 mils (i.e., from about 10 to about 50 microns).

Notable within the planar spiral inductor structure of the present invention as illustrated within the schematic cross-sectional diagram of FIG. 3 is that the bond wire 15 has incorporated therein additional lead length, in particular as illustrated within the context of several loops (i.e., a minimum of one loop and preferably a plurality of loops), compressed in a location near the spirally patterned conductor layer 12d which forms the bond pad 14. Within the present invention, the presence of the lead length within the bond wire 15 with the minimum of one loop and preferably the plurality of loops at the location near the spirally patterned conductor layer 12d which forms the bond pad 14 provides for an additional tunable inductance when fabricating a microelectronic inductor structure in accord with the present invention. Typically and preferably, the lead length within the bond wire is formed of a length from about 1000 to about 100,000 microns, to provide a tunable inductance to the microelectronic inductor structure whose schematic cross-sectional diagram is illustrated in FIG. 3 of from about 0.5 to about 5 nano-Henry in addition to a base inductance of the planar spiral inductor structure as illustrated within the schematic plan view diagram of FIG. 1 of from about 0.5 to about 30 nano-Henry.

Figure 4:
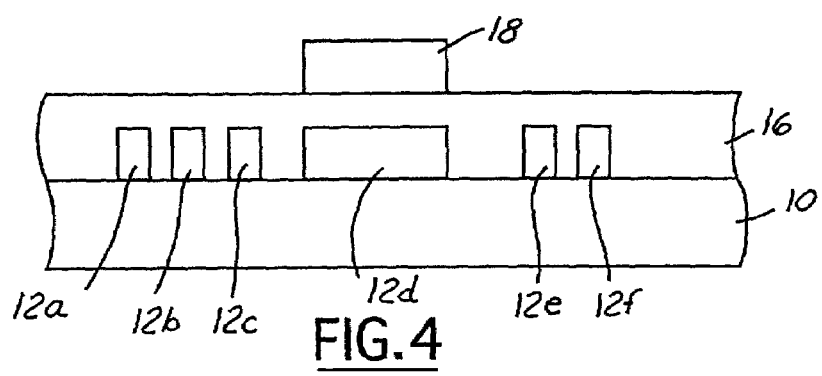
FIG. 4 and FIG. 5 show a pair of schematic cross-sectional diagrams illustrating the results of an alternate further processing of the microelectronic inductor structure whose schematic cross-sectional diagram is illustrated in FIG. 2 to provide the microelectronic inductor structure in conjunction with a microelectronic capacitor structure.

Referring now to FIG. 4, there is shown a schematic cross-sectional diagram illustrating the results of an alternative further processing of the microelectronic fabrication whose schematic cross-sectional diagram is illustrated in FIG. 2.

Shown in FIG. 4 is a schematic cross-sectional diagram of a microelectronic fabrication otherwise equivalent to the microelectronic fabrication whose schematic cross-sectional diagram is illustrated in FIG. 2, but wherein, in a first instance, there is formed encapsulating the series of spirally patterned conductor layers 12a, 12b, 12c, 12d, 12e and 12f a dielectric layer 16 which separates the spirally patterned conductor layer 12d which comprises the bond pad region 14 as illustrated in FIG. 1 to FIG. 3, and now comprises a first capacitor plate, from a second capacitor plate 18, and thus there is formed from the spirally patterned conductor layer 12d which now comprises the first capacitor plate, and the second capacitor plate 18, a planar capacitor structure in conjunction with the planar spiral inductor structure of the present invention.

Within the preferred embodiment of the present invention with respect to the dielectric layer 16, the dielectric layer 16 may be formed from any of several dielectric materials as are conventional in the art of microelectronic fabrication, including but not limited to conventional higher dielectric constant (i.e., greater than about 3.9) silicon containing dielectric materials, such as but not limited to silicon oxide dielectric materials, silicon nitride dielectric materials and silicon oxynitride dielectric materials, as well as lesser conventional lower dielectric constant (i.e., less than about 3.9) dielectric materials, such as but not limited to organic polymer spin-on-polymer dielectric materials and spin-on-glass (SOG) dielectric materials.

Similarly, within the present invention and the preferred embodiment of the present invention the dielectric layer 16 may be formed as a laminate of dielectric materials comprising, for example and without limitation; (1) a first dielectric material formed interposed between but not above the series of spirally patterned conductor layers 12a, 12b, 12c, 12d, 12e and 12f; and (2) a second dielectric material formed upon the upper surfaces of the series of spirally patterned conductor layers 12a, 12b, 12c, 12d, 12e and 12f and a series of first dielectric layers formed interposed between, but not above, the series of spirally patterned conductor layers 12a, 12b, 12c, 12d, 12e and 12f. When fabricating the dielectric layer 16 as such a laminated bilayer dielectric layer, it is desirable to employ a planarizing method, such as but not limited to a chemical mechanical polish (CMP) planarizing method or a reactive ion etch (RIE) etchback planarizing method, such as to clear the upper surfaces of the spirally patterned conductor layers 12a, 12b, 12c, 12d, 12e and 12f, and in particularly the spirally patterned conductor layer 12d which serves as the first capacitor plate, such that a thickness of a second dielectric layer which is formed interposed between spirally patterned conductor layer 12d and the second capacitor plate 18 may be readily controlled in composition and thickness. Similarly, such a bilayer construction for the dielectric layer 16 also clearly allows for the use of a different first dielectric material interposed between the series of spirally patterned conductor layers 12a, 12b, 12c, 12d, 12e and 12f, in comparison with a second dielectric material formed interposed between the spirally patterned conductor layer 12d which serves as the first capacitor plate, and the second capacitor plate 18. Such is desirable within the art of microelectronic fabrication insofar as it is then possible to more readily and independently fine tune the electrical properties of both of the planar spiral inductor structure and the planar capacitor structure whose schematic cross-sectional diagram is illustrated in FIG. 4 by adjustment of the dielectric materials which comprise the first dielectric material and the second dielectric material.

Within the preferred embodiment of the present invention with respect to the second capacitor plate 18, the second capacitor plate 18 may be formed employing methods and materials as are conventionally employed for forming capacitor plate layers within microelectronic fabrications, where, similarly with the material from which is formed the spirally patterned conductor layers 12*a*, 12*b*, 12*c*, 12*d*, 12*e* and 12*f*, such materials may include but not limited to metals, metal alloys, doped polysilicon and polycide materials. Typically and preferably, the second capacitor plate 18 is formed to a thickness analogous or equivalent to the thickness of the spirally patterned conductor layers 12*a*, 12*b*, 12*c*, 12*d*, 12*e* and 12*f*.

Although not specifically illustrated within the schematic cross-sectional diagram of FIG. 4, it is desirable that the second capacitor plate 18 also be patterned with electrically interconnected sub-patterns in a fashion analogous or equivalent to the spirally patterned conductor layer 12*d* which forms the bond pad region 14 as illustrated within the schematic plan view diagram of FIG. 1.

Similarly, although the preferred embodiment of the present invention as illustrated within the schematic cross-sectional diagram of FIG. 4 illustrates the present invention within the context of the second capacitor plate 18 formed above the planar spiral inductor structure of the present invention, a functionally equivalent microelectronic fabrication comprising a microelectronic inductor structure in conjunction with a microelectronic capacitor structure may also be fabricated in accord with the present invention with a second capacitor plate formed below a planar spiral inductor structure in accord with the present invention.

Further, the planar spiral inductor structure and the planar capacitor structure of the present invention may also be connected in a series arrangement, a parallel arrangement or an other electrical arrangement, as is required within a microelectronic fabrication within which is employed the planar spiral inductor structure in conjunction with the planar capacitor structure of the present invention.

Figure 5:
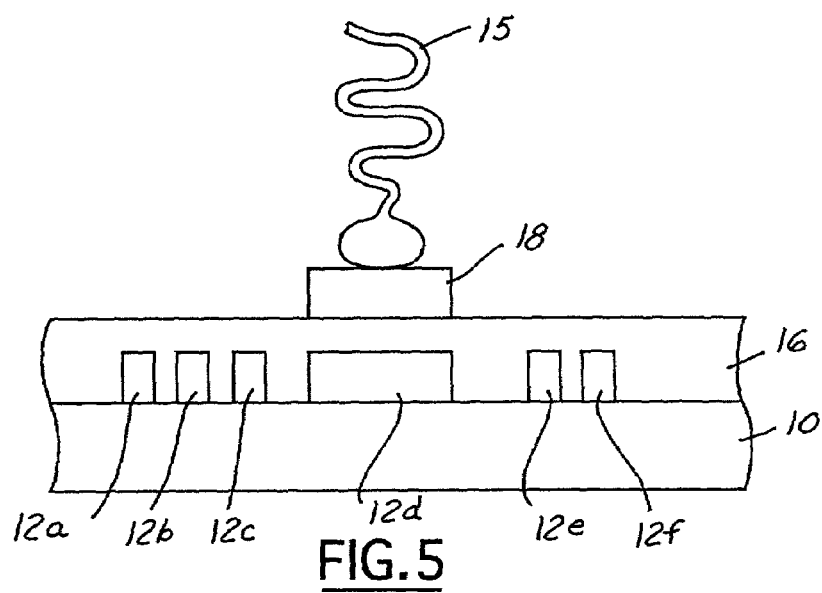

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein there is bonded onto the bond pad 18 a bond wire 15. The bond wire 15 as bonded onto the bond pad 18 within the microelectronic fabrication whose schematic cross-sectional diagram is illustrated in FIG. 5 is bonded employing methods materials and dimensions analogous or equivalent to the methods, materials and dimensions employed in bonding the bond wire 15 upon the spirally patterned conductor layer 12*d* as illustrated within the schematic cross-sectional diagram of FIG. 3. Similarly, as is understood by a person skilled in the art, and in conjunction with the instant disclosure, the additional lead length within the bond wire 15 bonded to the second capacitor plate 18 also provide an additional inductor in series with the planar capacitor of the present invention which is fabricated in conjunction with the planar spiral inductor of the present invention.

Yet similarly, as is additionally understood by a person skilled in the art, although the preferred embodiments of the present invention illustrate the present invention within the context of a microelectronic inductor structure comprising a spirally patterned conductor layer which terminates in a microelectronic structure formed within the center of the spirally patterned conductor layer, and wherein the spirally patterned conductor layer forms a planar spiral inductor, and further wherein the microelectronic structure formed within the center of the spirally patterned conductor layer further comprises a series of electrically interconnected sub-patterns and yet further wherein the microelectronic structure is illustrated within the context of a bond pad or a capacitor contiguous with a bond pad, the present invention may employ as the microelectronic structure, microelectronic structures including but not limited to resistors, diodes, capacitors and bond pads arranged and interconnected within any of several series and parallel connections wherein multiple microelectronic structures may be horizontally aligned or vertically stacked.

Upon forming the microelectronic fabrication whose schematic cross-sectional diagram is illustrated in FIG. 5, there is formed a microelectronic fabrication having formed therein a microelectronic inductor structure in conjunction with a microelectronic capacitor structure formed with optimal performance while occupying minimal microelectronic substrate area within the microelectronic fabrication. The microelectronic inductor structure in conjunction with the microelectronic capacitor structure exhibits optimal performance insofar as there is preferably employed a pair of patterned capacitor plates within the microelectronic capacitor structure such that there is avoided an eddy current within the microelectronic inductor structure in conjunction with the microelectronic capacitor structure. Similarly, the microelectronic inductor structure in conjunction with the microelectronic capacitor structure occupies minimal microelectronic substrate area insofar as the microelectronic capacitor structure is formed within a cavity defined by the microelectronic inductor structure.

As is understood by a person skilled in the art, the preferred embodiments of the present invention are illustrative of the present invention rather than limiting of the present invention. Revisions and modifications may be made to methods, materials, structures and dimensions through which is fabricated a microelectronic fabrication in accord with the preferred embodiments of the present invention while still fabricating a microelectronic fabrication in accord with the present invention, further in accord with the appended claims.

What is claimed is:

1. A microelectronic fabrication comprising:
  a substrate;
  a spirally patterned conductor layer formed over the substrate, wherein the spirally patterned conductor layer terminates in a microelectronic structure formed within the center of the spirally patterned conductor layer, wherein the spirally patterned conductor layer forms a planar spiral inductor, and wherein the microelectronic structure formed within the center of the spirally patterned conductor layer comprises a series of electrically interconnected sub-patterns; and
  a bond wire bonded upon the microelectronic structure, wherein the bond wire has incorporated therein a minimum of one loop.

2. A microelectronic fabrication comprising:
a substrate;
a spirally patterned conductor layer formed over the substrate, wherein the spirally patterned conductor layer terminates in a microelectronic structure formed within the center of the spirally patterned conductor layer, wherein the spirally patterned conductor layer forms a planar spiral inductor, and wherein the microelectronic structure formed within the center of the spirally patterned conductor layer comprises a series of electrically interconnected sub-patterns; and
a bond wire bonded upon the microelectronic structure, wherein the bond wire has incorporated therein a plurality of loops.

* * * * *